US012362255B2

(12) United States Patent
Boo et al.

(10) Patent No.: US 12,362,255 B2
(45) Date of Patent: Jul. 15, 2025

(54) APPARATUS INCLUDING DIRECT-CONTACT HEAT PATHS AND METHODS OF MANUFACTURING THE SAME

(71) Applicant: Micron Technology, Inc., Boise, ID (US)

(72) Inventors: Kelvin Tan Aik Boo, Singapore (SG); Hong Wan Ng, Singapore (SG); Seng Kim Ye, Singapore (SG); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 97 days.

(21) Appl. No.: 17/412,604

(22) Filed: Aug. 26, 2021

(65) Prior Publication Data

US 2023/0066375 A1 Mar. 2, 2023

(51) Int. Cl.
*H01L 23/367* (2006.01)
*H01L 21/48* (2006.01)
*H01L 21/56* (2006.01)
*H01L 23/31* (2006.01)
*H01L 23/498* (2006.01)

(52) U.S. Cl.
CPC ...... *H01L 23/3675* (2013.01); *H01L 21/4853* (2013.01); *H01L 21/4882* (2013.01); *H01L 21/565* (2013.01); *H01L 23/3128* (2013.01); *H01L 23/49827* (2013.01); *H01L 23/49838* (2013.01)

(58) Field of Classification Search
None
See application file for complete search history.

(56) References Cited

U.S. PATENT DOCUMENTS

| 6,657,864 | B1 | 12/2003 | Dyckman et al. |
| 10,991,669 | B2 | 4/2021 | Chou et al. |
| 11,362,044 | B2 | 6/2022 | Lin et al. |
| 2001/0003373 | A1* | 6/2001 | Akram ............... H01L 23/5383 257/E23.079 |

(Continued)

FOREIGN PATENT DOCUMENTS

| TW | 200917395 A | 4/2009 |
| TW | 201034160 A | 9/2010 |

(Continued)

OTHER PUBLICATIONS

TW Patent Application No. 111126623—Taiwanese Office Action and Search Report, dated May 5, 2023, with English Translation, 20 pages.

(Continued)

*Primary Examiner* — Jay C Chang
(74) *Attorney, Agent, or Firm* — Dorsey & Whitney LLP

(57) ABSTRACT

Semiconductor devices including thermally conductive structures are disclosed herein. A heat transfer structure may be thermally coupled to a semiconductor device and directly attached to a signaling layer of a substrate. The heat transfer structure may be configured to remove thermal energy from the semiconductor device and transfer at least a portion of the removed thermal energy directly into the signaling layer for dissipation within the substrate, for transfer through the substrate and out of a corresponding apparatus, or a combination thereof.

12 Claims, 10 Drawing Sheets

(56) References Cited

U.S. PATENT DOCUMENTS

| | | | |
|---|---|---|---|
| 2002/0060369 A1 | 5/2002 | Akram | |
| 2004/0065963 A1* | 4/2004 | Karnezos | H01L 23/3128 |
| | | | 257/E23.092 |
| 2007/0200210 A1 | 8/2007 | Zhao et al. | |
| 2009/0051038 A1 | 2/2009 | Jobetto | |
| 2011/0049704 A1 | 3/2011 | Sun et al. | |
| 2011/0304045 A1 | 12/2011 | Liu et al. | |
| 2012/0086109 A1* | 4/2012 | Kim | H01L 21/561 |
| | | | 257/659 |
| 2012/0133051 A1 | 5/2012 | Knickerbocker et al. | |
| 2012/0292745 A1* | 11/2012 | Park | H01L 23/3128 |
| | | | 257/E21.705 |
| 2014/0239477 A1 | 8/2014 | Kim et al. | |
| 2017/0162527 A1* | 6/2017 | Kim | H01L 23/5226 |

FOREIGN PATENT DOCUMENTS

| | | |
|---|---|---|
| TW | 201108360 A | 3/2011 |
| TW | 201201329 A | 1/2012 |
| TW | 201719834 A | 6/2017 |
| TW | 202114080 A | 4/2021 |

OTHER PUBLICATIONS

TW Patent Application No. 111126623—Taiwanese Office Action, dated Aug. 15, 2023, with English Translation, 15.
TW Patent Application No. 111126623—Taiwanese Office Action and Search Report, dated Jan. 4, 2024, with English Translation, 7 pages.

* cited by examiner

APPARATUS INCLUDING DIRECT-CONTACT HEAT PATHS AND METHODS OF MANUFACTURING THE SAME

TECHNICAL FIELD

The present technology is directed to apparatuses, such as semiconductor devices including memory and processors, and several embodiments are directed to semiconductor devices that include connection pads.

BACKGROUND

The current trend in semiconductor fabrication is to manufacture smaller and faster devices with a higher density of components for computers, cell phones, pagers, personal digital assistants, and many other products. However, decrease in circuit size often leads to the amount of heat generated and retained by the circuit. For example, the decrease in separation between heat-generating circuits can increase heat retention and/or eliminate the heat dissipation corresponding to the decreased separation.

DETAILED DESCRIPTION

Figure 1A:
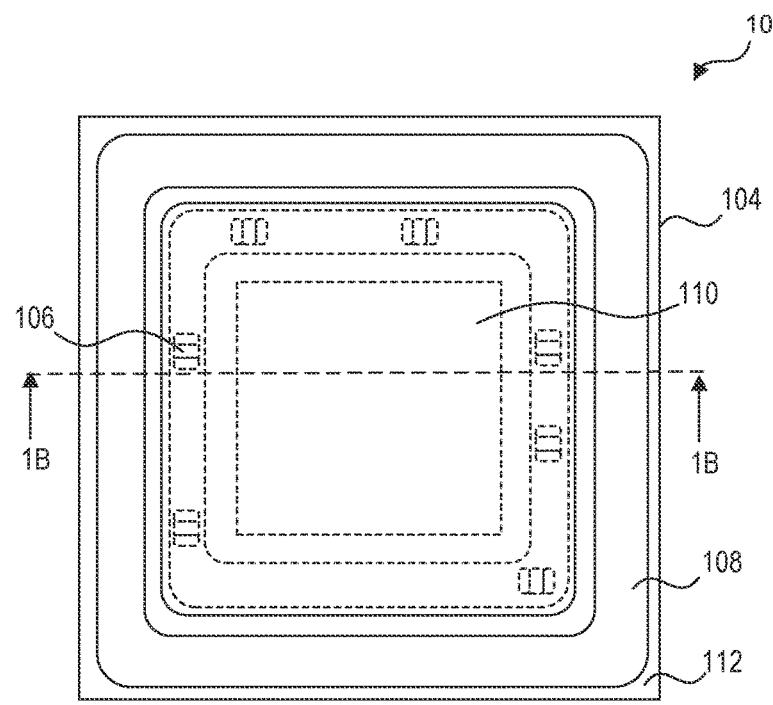
FIG. 1A-FIG. 1B illustrates an apparatus.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Several embodiments of semiconductor devices, packages, and/or assemblies in accordance with the present technology can include mechanisms for transferring thermal energy through direct connections between adjoining structures. For example, several embodiments of semiconductor devices, packages, and/or assemblies can include (1) a semiconductor device (e.g., a semiconductor die, such as a flip chip die) mounted over a substrate and/or (2) one or more thermally-conductive structures attached and thermally coupled to the semiconductor device. At least a portion of the one or more thermally-conductive structures can be directly connected (via, e.g., mechanical fastening means and/or a thermal adhesive) to a metal layer of the substrate, such as a ground plane and/or a connector layer nearest to the semiconductor die. Accordingly, thermal energy may be removed from the semiconductor device and routed directly to the metal layer (e.g., internal portions of the substrate).

The metal layer may be further connected to one or more Through-Silicon Vias (TSVs) that extend from the metal layer and at least partially across a thickness of the substrate. The TSVs may be coupled to external contacts (e.g., solder balls and/or other interconnects). The TSVs and/or the external contacts can include thermally and/or electrically conductive material (e.g., metallic material or graphene). Accordingly, the TSVs can receive or remove the thermal energy from the metal layer and route it through the thickness of the substrate and/or provide one or more thermal paths to the external contacts for removing the transferred thermal energy from a corresponding package.

In some embodiments, the substrate can include a top layer (e.g., solder resist) over the metal layer. The top layer can include an opening that exposes the metal layer, and the one or more thermally-conductive structures may be directly attached to the metal layer at or through the opening. In other embodiments, the substrate can be without the top layer and expose the metal layer to other structures in the package. Accordingly, the one or more thermally-conductive structures may be directly attached to the top layer without working around the top layer. In alternative embodiments, the heat removal mechanism (e.g., the one or more thermally-conductive structures) can correspond to a direct attachment between the semiconductor device (e.g., the active surface) and the exposed metal layer.

Figure 1B:
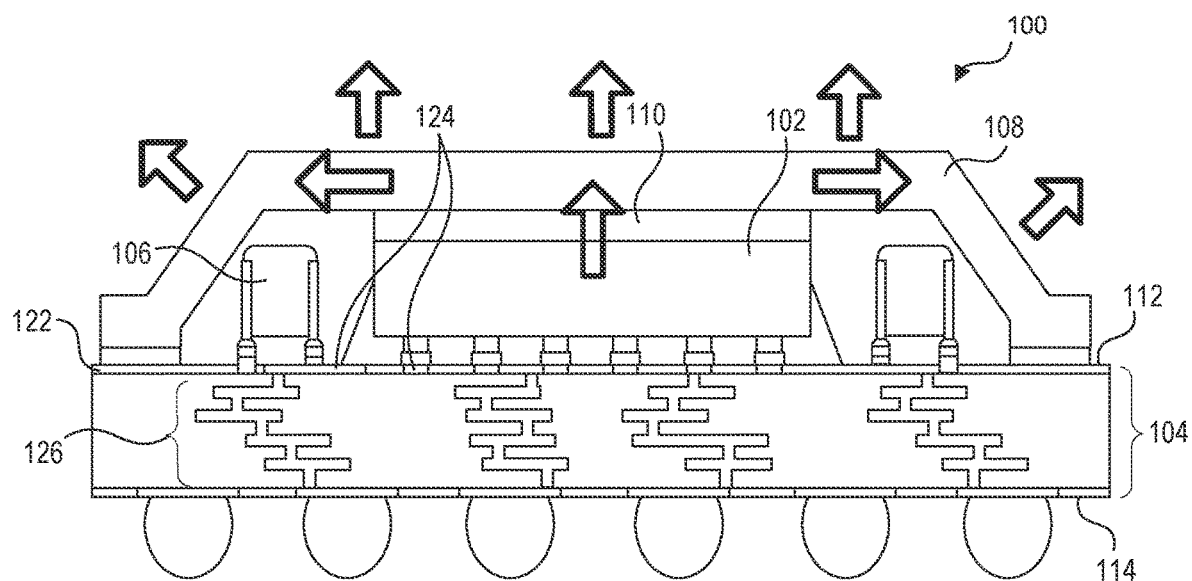

FIG. 1A-FIG. 1B illustrates an apparatus 100, such as a semiconductor device, package, or assembly. FIG. 1A illustrates a top view of the apparatus 100, and FIG. 1B illustrates a cross-sectional view of the apparatus 100 taken along line 1B—1B of FIG. 1A. Referring to FIG. 1A and FIG. 1B together, the apparatus 100 can include a semiconductor device 102 (e.g., a die, such as a flip chip) mounted on a substrate 104, such as a printed circuit board (PCB). The apparatus 100 can include one or more additional circuit components 106, such as capacitors. The apparatus 100 can further include a metal lid 108 attached over and overlapping the semiconductor die 102 and/or the one or more components 106. The metal lid 108 can be attached or connected to the semiconductor die 102 using a thermal adhesive 110. The metal lid 108 or one or more portions thereof (e.g., one or more top portions) may be exposed to external environments. Accordingly, the metal lid 108 may be configured to remove thermal energy from the semiconductor die 102 through the thermal adhesive 110 and/or dissipate the thermal energy to the surrounding environments.

The semiconductor die 102, the component(s) 106, and/or the metal lid 108 may be mounted or attached to a top surface 112 of the substrate 104. The substrate 104 can be configured to provide a set of electrical signal paths that couples external circuitry, such as using connectors or solder bumps on a bottom surface 114, to the semiconductor die 102 and/or the component(s) 106. Also, the metal lid 108 may be attached to the top surface 112 (e.g., non-conductive portions thereof).

As an illustrative example, the top surface 112 may be defined by solder resist 122 and connection pads 124 that are above or exposed through the solder resist 122. The semiconductor die 102 and/or the component(s) 106 can be electrically connected (via, e.g., solder) to the connection pads 124 on the top surface 112. The substrate 104 can include internal connections that route electrical signals vertically or between the top surface 112 and the bottom surface 114. The internal connections can include layers 126 (e.g., conductive or metallic planes) configured to route signals along lateral directions. The internal connections can be covered/overlapped by the top surface 112 and the bottom surface 114. In other words, the semiconductor die 102 and/or the component(s) 106 may indirectly access the internal connections, such as through the connection pads 124. Also, the metal lid 108 can be directly attached to/over the solder resist 122, such as using mechanical fastening means (e.g., slots) and/or adhesive material.

The attachment between the metal lid 108 and the solder resist 122 may be configured to control electrical connectivity and impede transfer of thermal energy. For example, the solder resist 122 may include material that is a thermal insulator in addition to an electrical insulator. Accordingly, the solder resist 122 may block or impede the transfer of thermal energy away from the metal lid 108. Even if the metal lid 108 is connected to a set of connection pads 124 and/or TSVs, such structures may provide limited surface area. As such, the limited contacting/flux area between the metal lid 108 and substrate 104 may limit the corresponding thermal transfer to ineffective amounts (e.g., in comparison to the external dissipation through top portions of the metal lid 108 and/or a threshold amount/rate).

Figure 2:
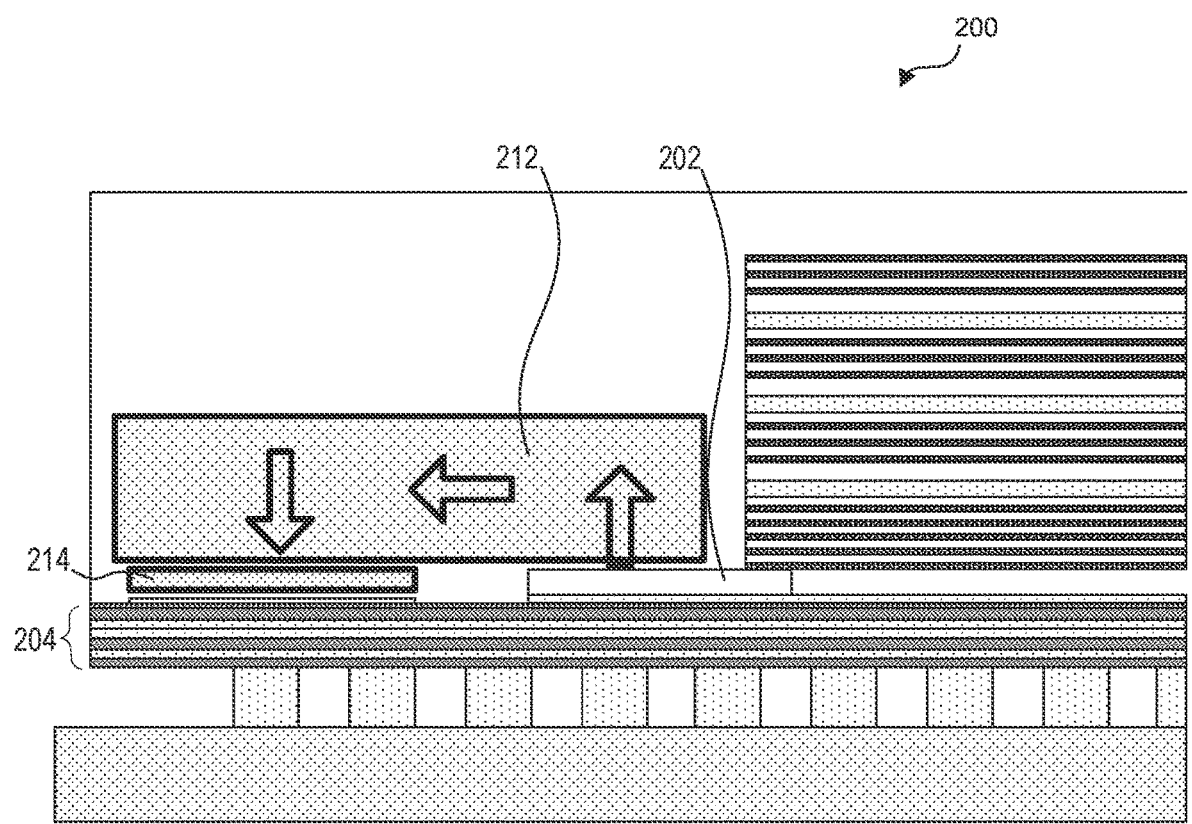
FIG. 2 illustrates a partial cross-sectional view of another apparatus.

FIG. 2 illustrates a partial cross-sectional view of another apparatus 200. The apparatus 200 can include a semiconductor device, assembly, package, or system, such as a stacked semiconductor package, High Bandwidth Memory (HBM), or the like, that includes multiple semiconductor devices or circuits. For example, the apparatus 200 can include a logic die and/or a set of memory dies mounted on a substrate 204 (e.g., PCB) having a thermal insulator (e.g., the solder resist) exposed on the top surface thereof. The mounted circuits may be encapsulated.

The apparatus 200 can include one or more thermal target devices 202, such as the logic die, that generates relatively large amounts of thermal energy during operation and/or that are negatively affected (e.g., increase in errors and/or decrease in processing speed) by heat. Accordingly, the apparatus 200 can be configured to manage or remove the thermal energy from the thermal target device 202. In some embodiments, the apparatus 200 can include a first spacer 212 that at least partially overlaps and is thermally coupled (via, e.g., direct attachment using a thermal adhesive) to the target device 202. The first spacer 212 can be over and thermally coupled to a second spacer 214 that is displaced along a lateral direction away from the thermal target device 202. The second spacer 214 can be mounted over the substrate 204.

The first and second spacers 212 and 214 can include thermally conductive material, such as metallic material or graphene. Accordingly, the spacers 212 and 214 can remove the thermal energy from the target device 202. However, dissipation of the removed thermal energy may be limited, such as due to the surrounding encapsulant and/or the thermal insulator (e.g., the solder resist) physically interfacing or attached to the second spacer 214.

FIG. 3A-FIG. 3C illustrate a first example apparatus 300 in accordance with embodiments of the technology. FIG. 3A illustrates a top view of the apparatus 300, FIG. 3B illustrates a cross-sectional view of the apparatus 300 taken along a line 3B—3B of FIG. 3A, and FIG. 3C illustrates a top view of a semiconductor device 302 (e.g., a die, such as a flip chip) and a substrate 304 (e.g., PCB) of the apparatus 300. Referring to FIG. 3A, FIG. 3B, and FIG. 3C together, the apparatus 100 can include a heat transfer structure 308 (e.g., a lid structure including metallic or other thermally conductive material) attached over and overlapping the semiconductor device 302 and any additional components (e.g., components 106 of FIG. 1B). The heat transfer structure 308 can be thermally coupled (via, e.g., direct attachment/connection) to the semiconductor device 302 using a thermal adhesive 310. Accordingly, the heat transfer structure 308 may be configured to remove thermal energy away from the semiconductor device 302 through the thermal adhesive 310 and transfer the removed thermal energy to one or more other structures. In some embodiments, the apparatus 300 can include an encapsulant 311 at least partially encasing and/or surrounding components therein, such as the heat transfer structure 308, the semiconductor device 302, the substrate 304, etc.

In some embodiments, the heat transfer structure can include a continuous structure having integral sections. For example, the heat transfer structure 308 can be formed or shaped, such as by a stamping process, from a metal (e.g., copper) sheet. The heat transfer structure 408 can include a top planar portion that attaches to the thermal adhesive 310. The top planar portion can be integral with a vertical or an angular portion that extends down towards the substrate 404. The downward portion can be integral with a foot portion configured to attach to the substrate 404. In other embodiments, the heat transfer structure can include a combination of physically separate and attached structures and/or structures having different materials therein.

The semiconductor device 302 may be mounted or attached to a top surface 312 of the substrate 304. The top surface 312 may be defined by a protective layer 322 (e.g., solder resist) and connection pads that are above or exposed through the protective layer 322. The semiconductor device 302 can be electrically connected (via, e.g., solder) to the connection pads on the top surface 312. Using the connection pads, the substrate 304 can be configured to provide a set of electrical signal paths that connect internal circuitry and/or couples to external circuitry, such as using external connectors 316 (e.g., solder bumps) on a bottom surface 314. For example, the substrate 304 can include internal connections 326 (e.g., traces, TSVs, connection planes/layers, or the like) that route electrical signals vertically between the top surface 312 and the bottom surface 314 and/or along lateral directions. The internal connections can be generally covered/overlapped by the top surface 312 and the bottom surface 314.

The substrate 304 can include an interface opening 332 in the protective layer 322 that exposes at least a portion of the internal connections 326. In some embodiments, the interface opening 332 can expose an interfacing layer 334 (e.g., a top conductive layer and/or a grounding layer) within the substrate 304. The substrate 304 can include a relatively large quantity (e.g., with respect to connecting to a single structure, such as for three or more) of adjacent TSVs 336 under the interface opening 332. The interface opening 332 can be configured (according to shape and/or dimensions) to facilitate a direct attachment between the exposed (portion of) the interfacing layer 334 and the heat transfer structure 308. Some examples of the direct attachment between the interfacing layer 334 and the heat transfer structure 308 can include mechanical fasteners and/or thermal adhesives. Accordingly, the heat transfer structure 308 can be thermally coupled, through direct attachments, to both the semiconductor device 302 and the internal connections 326 within the substrate 304.

The direct attachment between the interfacing layer 334 and the heat transfer structure 308 through the interface opening 332 provides increased performance for the semiconductor device 302. The direct attachment can increase the amount of heat removed from the semiconductor device 302 by providing a heat dissipation path into and through the substrate 304. The interface opening 332 can remove any thermal impedance from the protective layer 322. Further, by directly attaching to the interfacing layer 334, the apparatus 300 can increase the amount of material (e.g., the grounding path/plane) that can draw heat away from the semiconductor device 302 and also increase the surface area and contacting structures (e.g., internal portions of the substrate 304) for dissipating the removed heat. Moreover, the direct attachment can provide a thermally conductive path through the TSVs 336 and the external connectors 316 for transferring the thermal energy out of the apparatus 300 and to external structures (e.g., system substrates, heat sinks, or the like). Accordingly, the semiconductor device 302 can operate at higher speeds, longer durations, and/or with less errors based on the increased amount of heat removal.

Figure 4:
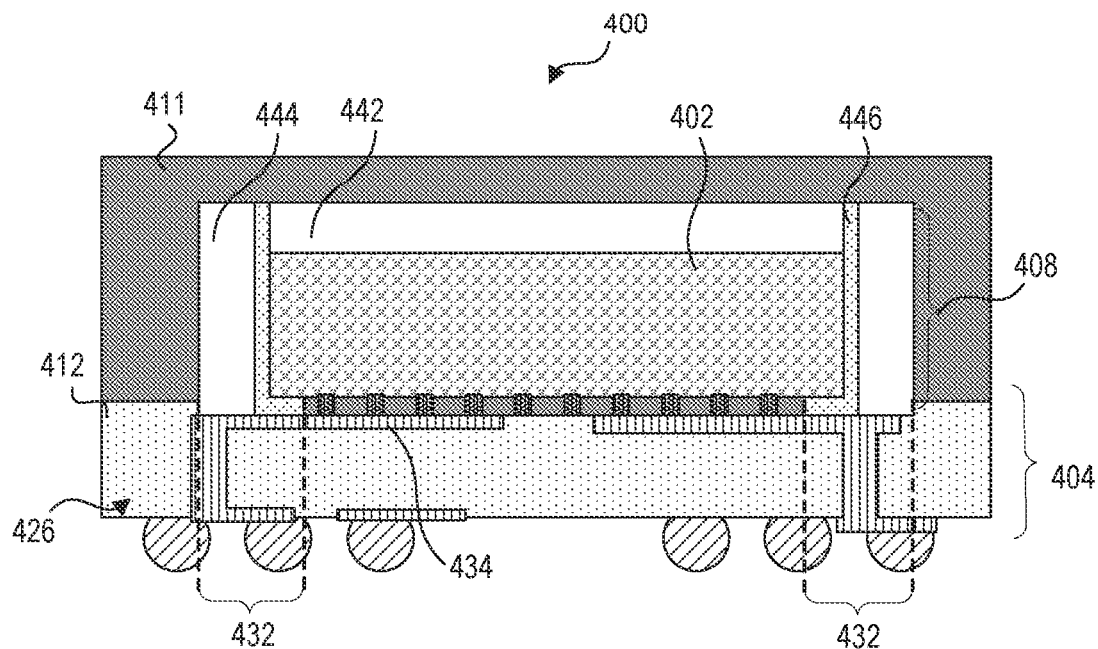
FIG. 4 illustrates a second example apparatus in accordance with embodiments of the technology.

FIG. 4 illustrates a second example apparatus 400 in accordance with embodiments of the technology. The apparatus 400 can include a semiconductor device 402 (e.g., a die, such as a flip chip) mounted on a substrate 404 (e.g., PCB), with a heat transfer structure 408 thermally coupled to the semiconductor device 402. The heat transfer structure 408 can be configured to transfer thermal energy away from the semiconductor device 402 and to another structure, such as the substrate 404. The apparatus 400 can include an encapsulant 411 at least partially encasing and/or surrounding components therein, such as the heat transfer structure 408, the semiconductor device 402, the substrate 404, etc.

The substrate 404 can have a top surface 412 that is at least partially defined by or exposes the internal connection 426. For example, the substrate 404 can include the interface openings 432 that exposes at least a portion of an interfacing layer 434 (e.g., a top conductive layer, a grounding layer, a patterned layer, etc.). The heat transfer structure 408 may be directly attached to the exposed portion of the interfacing layer 434 through the interface openings 432 similarly as described above.

As described above, the heat transfer structure can include a continuous structure or a combination of separate/different structures. As an example of the latter, in some embodiments, the heat transfer structure 408 can include a top structure 442 (e.g., a metallic lid or plate) and a peripheral structure 444 (e.g., a metallic ring or wall). The top structure 442 and the peripheral structure 444 can be thermally coupled to each other and/or the semiconductor device 402, such as through direct contact and/or a thermal interface material (TIM) 446. Accordingly, the heat transfer structure 408 can thermally couple to multiple surfaces/portions of the semiconductor device 402, thereby increasing the capacity to remove heat from the semiconductor device 402. The removed heat can be dissipated across/through the internal connection 426, the inner portions of the substrate 404, and/or externally through the external connectors as described above.

Figure 5:
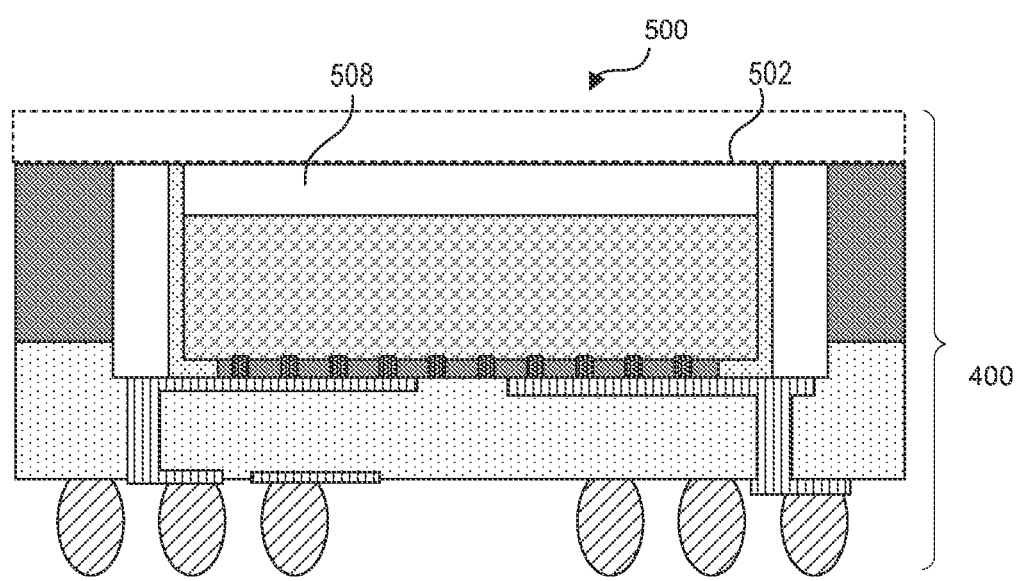
FIG. 5 illustrates a third example apparatus in accordance with embodiments of the technology.

FIG. 5 illustrates a third example apparatus 500 in accordance with embodiments of the technology. The apparatus 500 can correspond to the apparatus 400 of FIG. 4 with a top portion of the encapsulant 411 of FIG. 4 removed. Accordingly, the apparatus 500 can have an exposed top surface 502 for a heat transfer structure 508 (corresponding to the heat transfer structure 408 of FIG. 4). The exposed top surface 502 may have a covering or a treated surface that prevents corrosion or oxidization. The exposed top surface 502 can allow the heat transfer structure 508 to dissipate the removed heat into the surrounding environment (e.g., air or other coolants) instead of the encapsulant 411. Accordingly, the exposed top surface 502 can further increase the heat removal and dissipation capacity for the overall apparatus 500, the semiconductor die, and/or the heat transfer structure 508.

Figure 6:
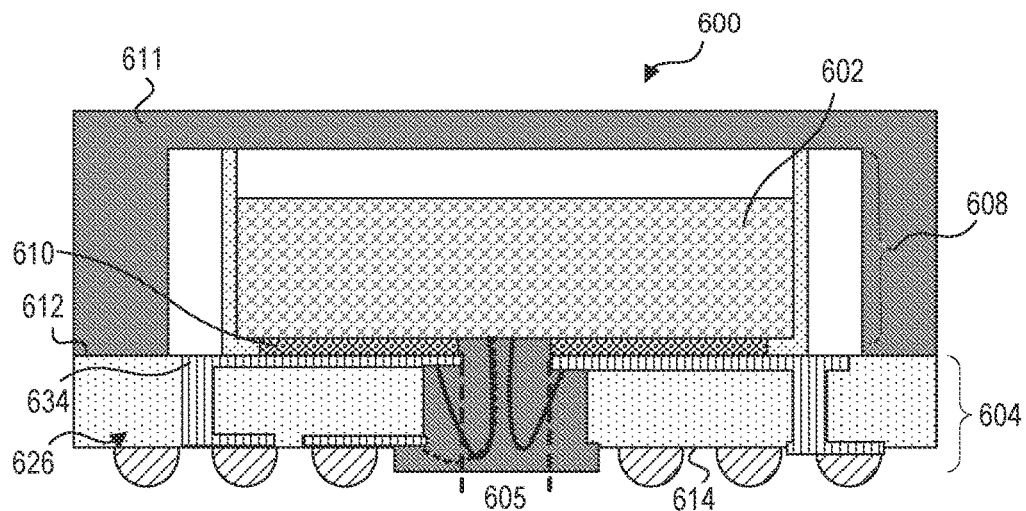
FIG. 6 illustrates a fourth example apparatus in accordance with embodiments of the technology.

FIG. 6 illustrates a fourth example apparatus 600 (e.g., a board-on-chip (BOC) device/package) in accordance with embodiments of the technology. The apparatus 600 can include a semiconductor device 602 mounted on a substrate 604 (e.g., a BOC substrate). The substrate 604 can include an opening 605 that extends through a thickness of the substrate 604, such as from a top surface 612 to a bottom surface 614 of the substrate. In some embodiments, the opening 605 can be located at a central portion of the substrate 604.

The opening 605 of the substrate 604 can be configured to facilitate electrical connections with the semiconductor device 602. For example, the semiconductor device 602 can include connection pads located within a predetermined region, such as a central portion on an active surface (e.g., a bottom surface as illustrated in FIG. 6). The substrate 604 can include an interfacing layer 634 on a top portion thereof. The interfacing layer 634 may include connection extensions/fingers that extend laterally into or over peripheral portions of the opening. The semiconductor device 602 can be mounted with the predetermined connector region over and/or aligned with the opening 605. The apparatus 600 can include bond wires in the opening 605. The bond wires can extend through the opening 605 and connect, thereby electrically coupling, (1) the connection pads on the semiconductor device 602 with (2) the connection fingers of the interfacing layer 634.

The apparatus 600 can further include a heat transfer structure 608 thermally coupled to the semiconductor die 602. The heat transfer structure 608 can be configured to transfer thermal energy away from the semiconductor die 602 and to another structure, such as the substrate 604. The apparatus 600 can include an encapsulant 611 at least partially encasing and/or surrounding components therein, such as the heat transfer structure 608, the semiconductor die 602, the substrate 604, etc. The encapsulant 611 can fill the opening 605 and encapsulate corresponding portions of the interfacing layer 634, the semiconductor die 602, and/or the bond wires.

In some embodiments, the substrate 604 can fully expose the interfacing layer 634 at the top surface 612. In other words, the substrate 604 can be without the protective layer 322 of FIG. 3B (e.g., solder resist). Accordingly, the heat transfer structure 608 may be directly attached to the interfacing layer 634 on the top surface 612. Also, the semiconductor die 602 can be directly attached (using, e.g., a thermal adhesive 610) to the top surface 612 and/or the interfacing layer 634. The direct physical attachment between the semiconductor die 602 and the top surface 612 and/or the interfacing layer 634 can increase the capacity (by, e.g., increasing contact/interfacing surface area) to remove heat from the semiconductor die 602 and into or through the substrate 604.

As described above, the heat transfer structure can include a continuous structure or a combination of separate/different structures. As an example of the latter, in some embodiments, the heat transfer structure 608 can include a top structure (e.g., a metallic lid or plate) and a peripheral structure (e.g., a metallic ring or wall). The top structure and the peripheral structure can be thermally coupled to each other and/or the semiconductor die 602, such as through direct contact and/or a thermal interface material. Accordingly, the heat transfer structure 608 can thermally couple to multiple surfaces/portions of the semiconductor die 602, thereby increasing the capacity to remove heat from the semiconductor die 602. The removed heat can be dissipated across/through the internal connection 626, the inner portions of the substrate 604, and/or externally through the external connectors as described above.

Figure 7:
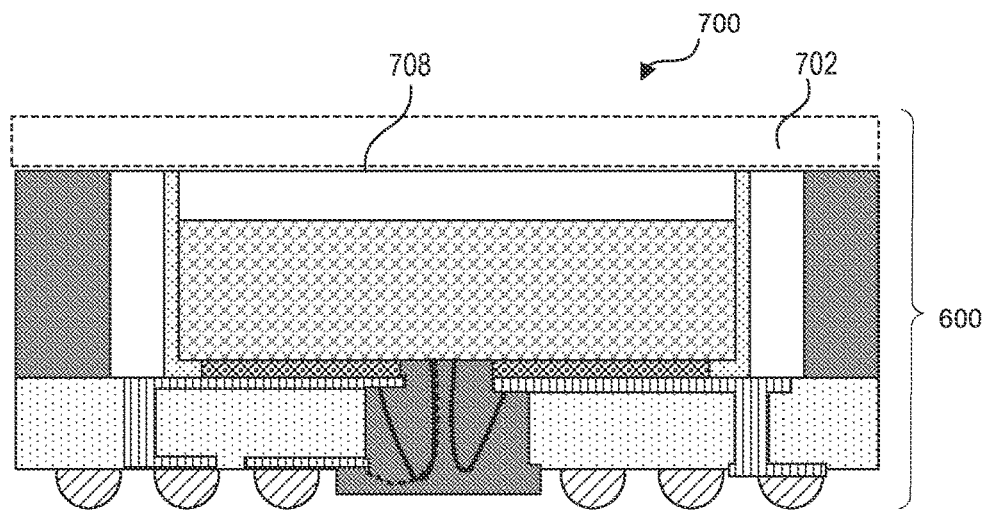
FIG. 7 illustrates a fifth example apparatus in accordance with embodiments of the technology.

FIG. 7 illustrates a fifth example apparatus 700 in accordance with embodiments of the technology. The apparatus 700 can correspond to the apparatus 600 of FIG. 6 with a top portion of the encapsulant 611 of FIG. 6 removed. Accordingly, the apparatus 700 can have an exposed top surface 702 for a heat transfer structure 708 (corresponding to the heat transfer structure 608 of FIG. 6). The exposed top surface 702 may have a covering or a treated surface that prevents corrosion or oxidization. The exposed top surface 702 can allow the heat transfer structure 708 to dissipate the removed heat into the surrounding environment (e.g., air or other coolants) instead of the encapsulant 611. Accordingly, the exposed top surface 702 can further increase the heat removal and dissipation capacity for the overall apparatus 700, the semiconductor die, and/or the heat transfer structure 708.

Figure 8:
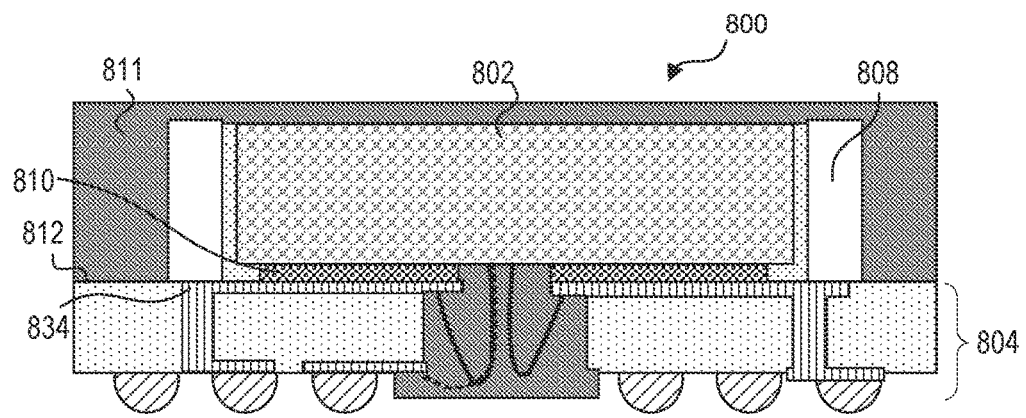
FIG. 8 illustrates a sixth example apparatus in accordance with embodiments of the technology.

FIG. 8 illustrates a sixth example apparatus 800 (e.g., a board-on-chip (BOC) device/package) in accordance with embodiments of the technology. The apparatus 800 can be similar to the apparatus 600 of FIG. 6 but with a different heat transfer structure 808. For example, a semiconductor device 802 can be mounted on or directly attached to a top surface 812 and/or an interfacing layer 834 of a substrate 804 using a thermal adhesive 810. The heat transfer structure 808 can include a peripheral structure (1) facing and/or surrounding one or more peripheral portions of the semiconductor device 802 and (2) directly attached to the top surface 812 of and/or the interfacing layer 834. The heat transfer structure 808 can include TIM filling any space between the peripheral structure and the semiconductor device 802, thereby thermally coupling the heat transfer structure 808 and the semiconductor device 802. Compared to the heat transfer structure 608 of FIG. 6, the heat transfer structure 808 can be without a top cover/lid portion. In other words, a top surface of the semiconductor device 802 can directly contact or be covered by an encapsulant 811. In some embodiments, the top surface of the semiconductor device 802 may be uncovered and/or exposed to the surrounding environment.

FIG. 9-FIG. 13 illustrate example phases for a manufacturing process in accordance with embodiments of the technology. The example phases can be for manufacturing the apparatus 300 of FIG. 3A, the apparatus 400 of FIG. 4, the apparatus 500 of FIG. 5, the apparatus 600 of FIG. 6, the apparatus 700 of FIG. 7, and/or the apparatus 800 of FIG. 8.

Figure 9:
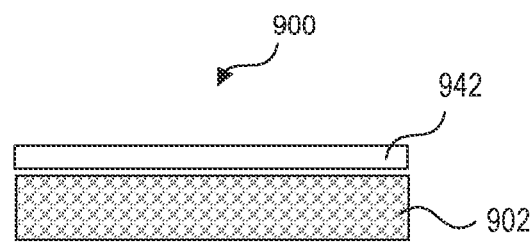
FIG. 9—FIG. 13 illustrate example phases for a manufacturing process in accordance with embodiments of the technology.

FIG. 9 illustrates a side view of structure 900 that corresponds to an example phase in accordance with embodiments of the technology. The structure 900 can include a heat transfer cover 942 and a semiconductor wafer 902. During the example phase, the heat transfer cover 942 (e.g., a plate including metallic material, such as copper) may be laminated on the semiconductor wafer 902 to form the structure 900. Accordingly, a backside of the semiconductor wafer 902 and the back sides of the corresponding dies can be thermally enhanced using the heat transfer cover 942.

Figure 10:
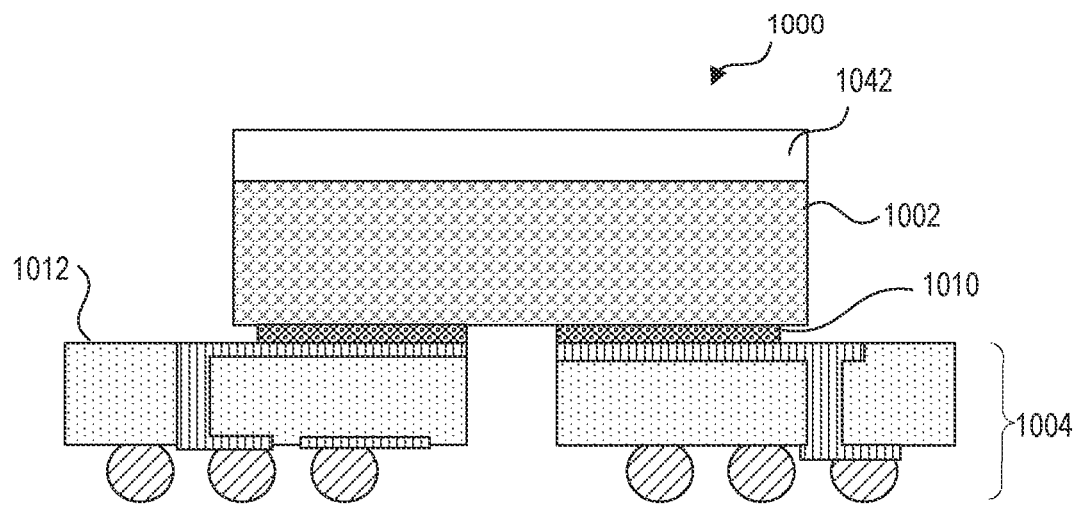

FIG. 10 illustrates an example phase that corresponds to a structure 1000 in accordance with embodiments of the technology. The structure 1000 can correspond to singulating dies from the structure 900 of FIG. 9, and mounting one or more of resulting components on a substrate 1004 (e.g., a PCB). For example, the structure 900 can be cut or singulated to produce a semiconductor die 1002 with a top cover 1042 attached or laminated thereon.

The semiconductor die 1002 can be mounted on a top surface 1012 of the substrate 1004. For example, the semiconductor die 1002 can be attached directly to the substrate 1004, such as using a thermal adhesive 1010. In some embodiments, the semiconductor die 1002 can be directly attached to an interfacing layer (e.g., a top conductive layer) or a portion thereof. In other embodiments, the semiconductor die 1002 can be mounted by placing internal connectors of the die on corresponding pads on the substrate 1004 and then forming the connection, such as by reflowing solder. Accordingly, the semiconductor die 1002 may be electrically coupled to internal connections (e.g., wiring layers) of the substrate 1004.

Figure 11A:
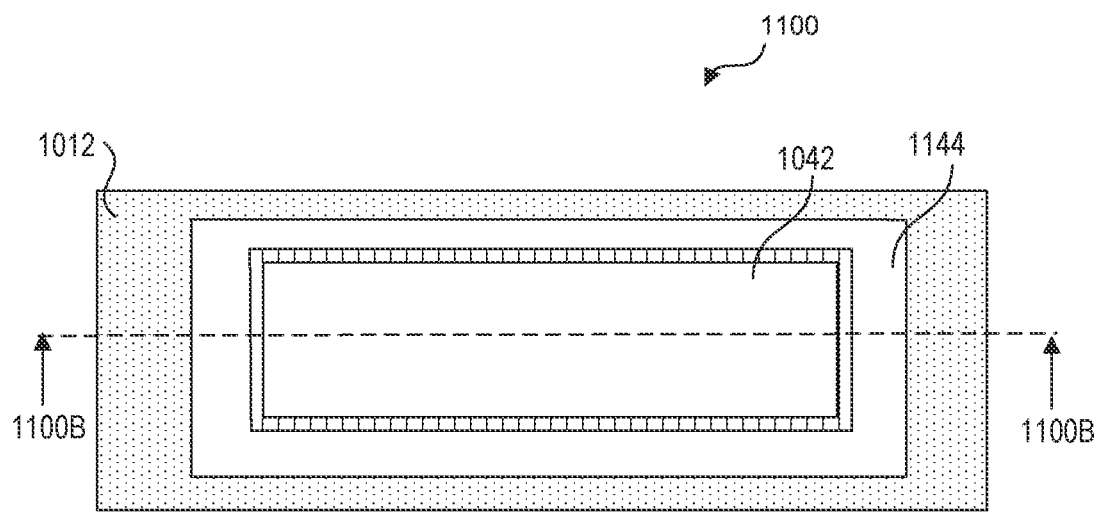
Figure 11B:
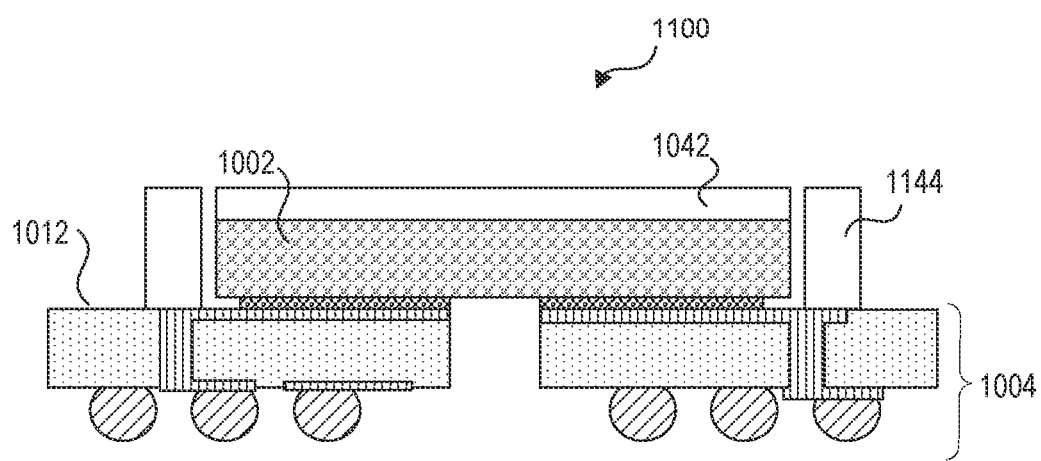

FIG. 11A and FIG. 11B illustrate an example phase that corresponds to a structure 1100 in accordance with embodiments of the technology. FIG. 11A can illustrate a top view of the structure 1100, and FIG. 11B can illustrate a cross-sectional view of the structure 1100 taken along a line 1100B—1100B of FIG. 11A. Referring to FIG. 11A and FIG. 11B together, the structure 1100 can correspond to attaching a peripheral structure 1144 facing or surrounding one or more peripheral portions or surfaces of the semiconductor die 1002. For example, the peripheral structure 1144 correspond to a ring or a wall structure that surrounds the semiconductor die 1002. The peripheral structure 1144 can include a thermally-conductive material (e.g., metallic material, such as copper, graphene, etc.) and/or same material as the top cover 1042.

The peripheral structure 1144 can be attached directly to the top surface 1012 and/or the interfacing layer of the substrate 1004. In some embodiments, the peripheral structure 1144 can be attached in or through an opening (e.g., the interface opening 332 of FIG. 3B, the interface openings 432 of FIG. 4, etc.). In other embodiments, the interfacing layer can be uncovered/exposed, and the peripheral structure 1144 can be attached directly (via, e.g., mechanical attachments and/or thermal adhesives) to the interfacing layer. Accordingly, through the direct attachments, the peripheral structure 1144 can be thermally coupled to the substrate 1004.

Figure 12:
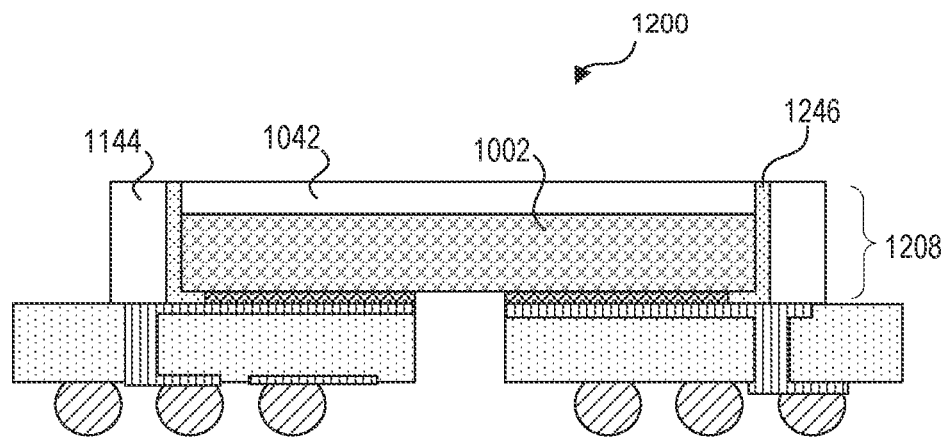

FIG. 12 illustrates an example phase that corresponds to a structure 1200 in accordance with embodiments of the technology. The structure 1200 can correspond to forming a heat transfer structure 1208, such as by thermally coupling the top cover 1042, the peripheral structure 1144, and/or the semiconductor die 1002. For example, the structure 1200 can include a TIM 1246 directly contacting the top cover 1042, the peripheral structure 1144, and/or the semiconductor die 1002. The example phase can correspond to injecting the TIM 1246 into a space between the peripheral structure 1144 and the surrounded structure, such as the semiconductor die 1002 and/or the top cover 1042.

Figure 13:
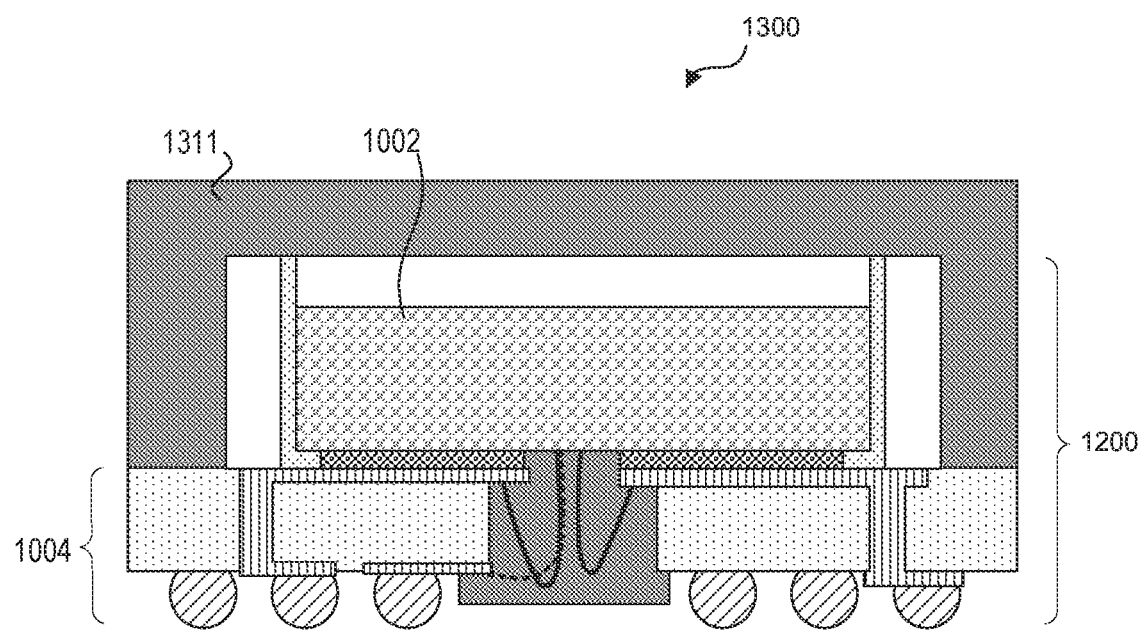

FIG. 13 illustrates an example phase that corresponds to a structure 1300 in accordance with embodiments of the technology. The structure 1300 can correspond to encapsulating the structure 1200 or a processing result thereof. In some embodiments, for example, wirebonds may be attached to electrically connect the semiconductor die 1002 to internal connection of the substrate 1004. An encapsulant 1311 may be applied over the substrate 1004, the semiconductor die 1002, and/or the heat transfer structure 1208. For example, the encapsulant 1311 may be flowed or pressed and subsequently cured (using, e.g., chemical agent, light, temperature, time, etc.) to for the structure 1300. The structure can correspond to the apparatus 300 of FIG. 3A, the apparatus 400 of FIG. 4, the apparatus 500 of FIG. 5, the apparatus 600 of FIG. 6, the apparatus 700 of FIG. 7, and/or the apparatus 800 of FIG. 8.

Figure 14:
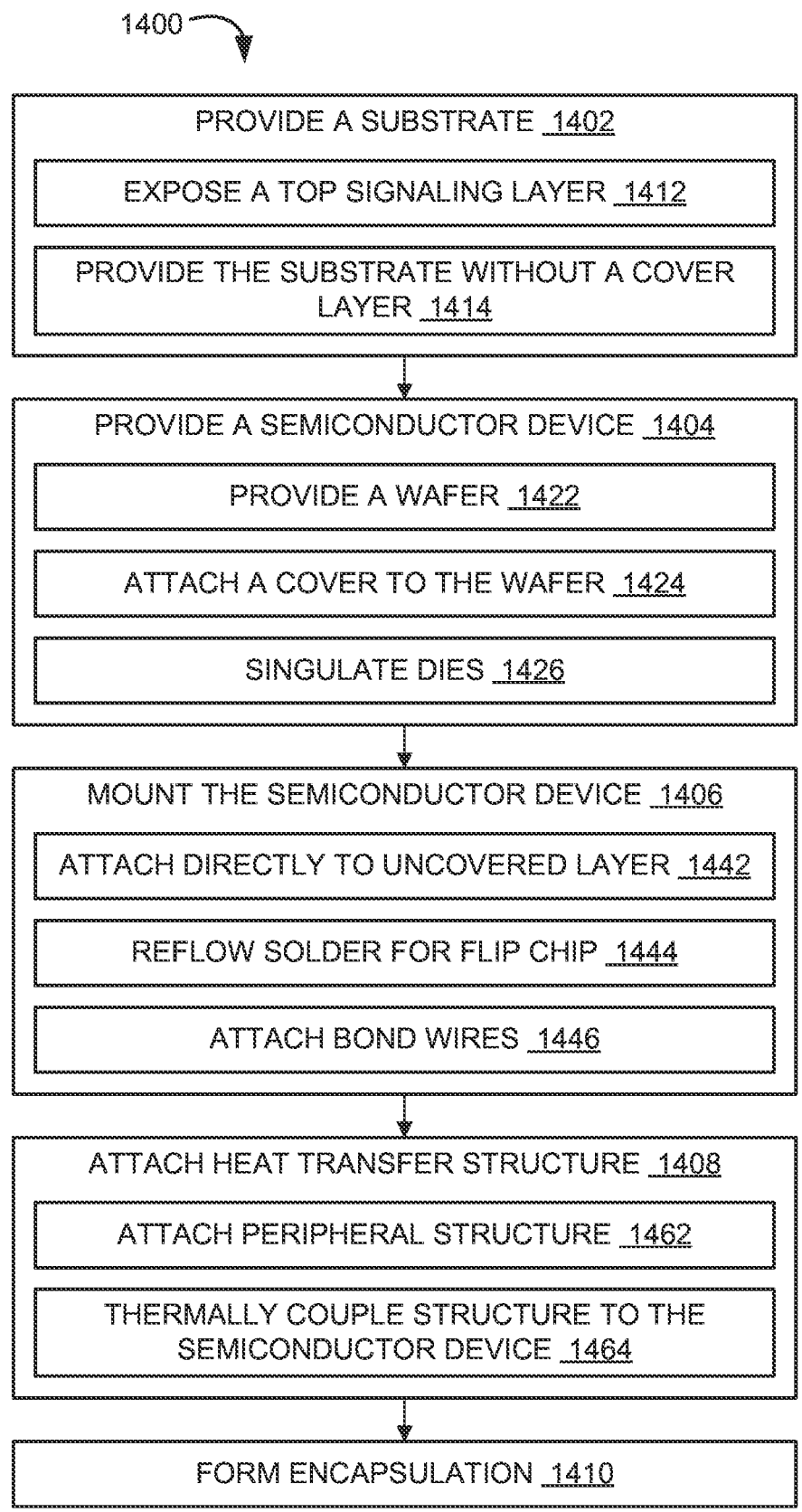
FIG. 14 is a flow diagram illustrating an example method of manufacturing an apparatus in accordance with an embodiment of the present technology.

FIG. 14 is a flow diagram illustrating an example method 1400 of manufacturing an apparatus (e.g., the apparatus 300 of FIG. 3A, the apparatus 400 of FIG. 4, the apparatus 500 of FIG. 5, the apparatus 600 of FIG. 6, the apparatus 700 of FIG. 7, and/or the apparatus 800 of FIG. 8) in accordance with an embodiment of the present technology.

Figure 3:
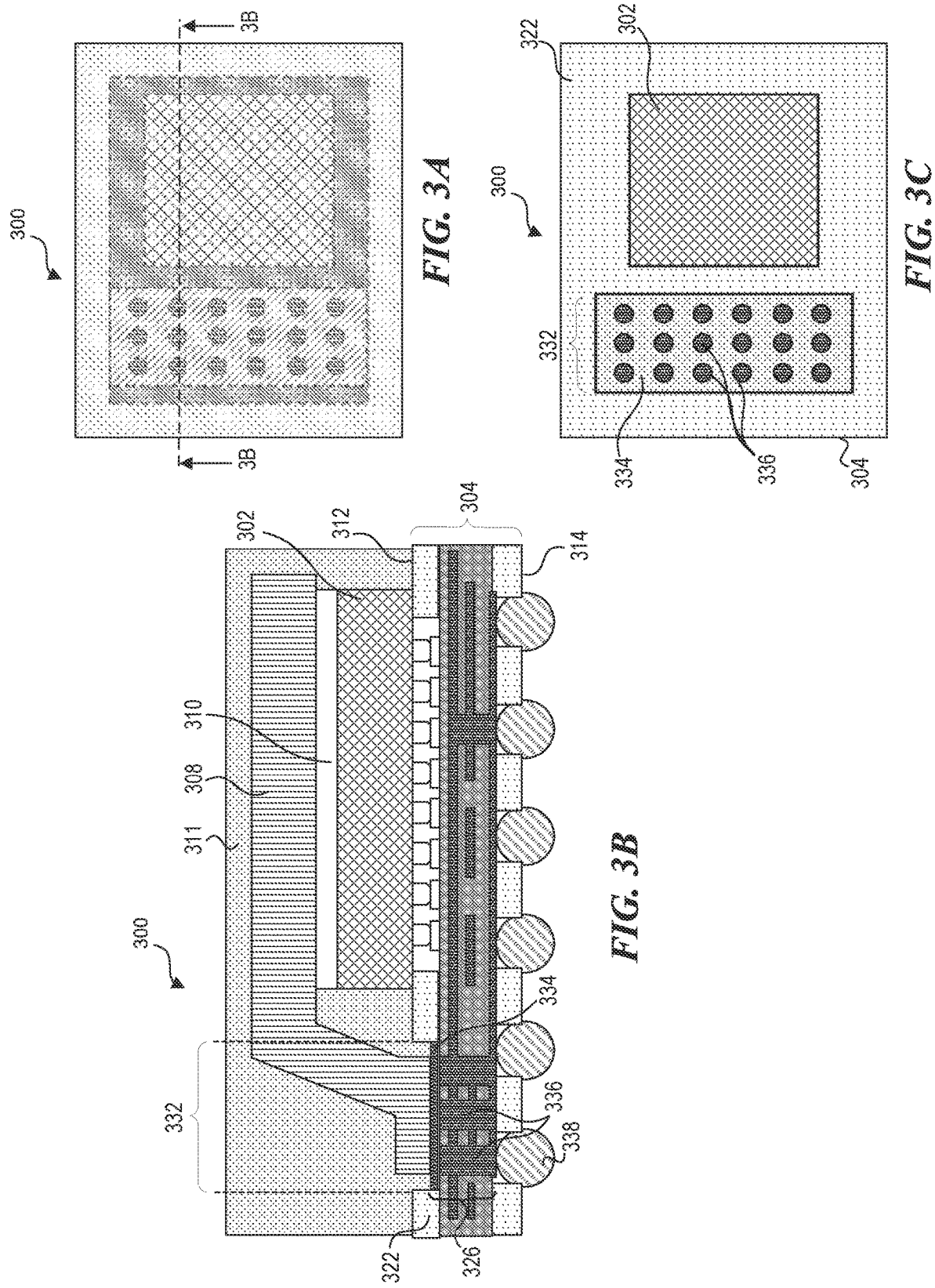
FIG. 3A-FIG. 3C illustrate a first example apparatus in accordance with embodiments of the technology.

At block 1402, the method 1400 can include providing a substrate (e.g., the substrate 304 of FIG. 3B, the substrate 404 of FIG. 4, the substrate 604 of FIG. 6, the substrate 804 of FIG. 8, and/or the substrate 1004 of FIG. 10). The provided substrate can include a top surface (e.g., the top surface 312 of FIG. 3 or the like) and a bottom surface (e.g., the bottom surface 314 of FIG. 3 or the like). The top surface can be configured to interface with a semiconductor device, and the bottom surface can be configured to interface with external circuits. The provided substrate can further include a signaling layer (e.g., the interfacing layer 334 of FIG. 3 or the like).

At least a portion of the signaling layer can be exposed on or through the top surface. In some embodiments, the method 1400 can include exposing at least a portion of a top signaling layer as illustrated at block 1412. For example, the provided substrate can include a protective layer extending across a lateral plane and over the signaling layer. A portion of the protective layer 322 of FIG. 3 may be removed (via, e.g., mechanical and/or chemical means) to form the interface opening 332 of FIG. 3, thereby exposing the portion of the top signaling layer. Also, the entirety of the protective layer 322 of FIG. 3 may be removed, thereby allowing the top signaling layer to be exposed/uncovered between opposing peripheral edges of the layer and form/define the top surface. Alternatively, the substrate may be provided without a cover layer (e.g., the protective layer 322) as illustrated in block 1414. Also, the substrate may be provided with the interface opening 332 formed therein.

At block 1404, the method 1400 can include providing a semiconductor device (e.g., the device 302 of FIG. 3B, the device 402 of FIG. 4, the device 602 of FIG. 6, the device 802 of FIG. 8, and/or the device 1002 of FIG. 10). For example, the provided semiconductor device can include a flip chip. Also, the provided semiconductor device can include the semiconductor die 1002 with the top cover 1042 of FIG. 10 attached to an inactive/back side of the die 1002.

In some embodiments, the providing semiconductor device may include processing or manufacturing the semiconductor device. For example, at block 1422, a semiconductor wafer may be provided. The semiconductor wafer may have an active side with integrated circuits formed thereon. The semiconductor wafer may have an inactive side opposite the active side. At block 1424, a thermal cover (e.g., a metallic plate) may be attached to the inactive side of the semiconductor wafer. At block 1426, dies may be formed by a cutting or singulation process. For example, the semiconductor wafer and the attached thermally conductive cover can be cut to separate/form the individual devices.

At block 1406, the method 1400 can include mounting the semiconductor device over the substrate. For example, the semiconductor device can be attached directly to the top surface of the substrate. In some embodiments, such as illustrated at block 1442, the semiconductor device can be attached directly (using, e.g., the thermally conductive adhesive) to the uncovered signaling layer, such as on the uncovered surface or through the interface opening. In some embodiments, such as illustrated at block 1444, mounting the semiconductor device (e.g., a flip chip) can include reflowing solder, thereby attaching the device to the substrate. At block 1446, bond wires may be attached to electrically connect the semiconductor device to the substrate.

At block 1408, the method 1400 can include attaching a heat transfer structure (e.g., the heat transfer structure 308 of FIG. 3, the heat transfer structure 408 of FIG. 4, the heat transfer structure 608 of FIG. 6, the heat transfer structure 808 of FIG. 8, or the like) over the substrate. In some embodiments, the heat transfer structure (e.g., the heat transfer structure 308) can include a continuous/solid/integral structure including thermally conductive material. The continuous heat transfer structure can be thermally coupled to the semiconductor die, such as through a direct attachment using a thermal adhesive (e.g., the adhesive 310 of FIG. 3). Also, the continuous heat transfer structure can be directly attached to the signaling layer.

In other embodiments, the heat transfer structure can include a set of separate structures. For example, the heat transfer structure can include the top cover 1042, the peripheral structure 1144 of FIG. 11, and/or the TIM 1246 of FIG. 12. At block 1462, a peripheral structure may be attached over the substrate. The peripheral structure may include a thermally conductive material and may be directly attached to the exposed signaling layer. The peripheral structure may face or surround one or more peripheral portions/surfaces of the top cover and/or the semiconductor device. In some embodiments, the peripheral structure may directly contact the top cover and/or the semiconductor device. At block 1464, the peripheral structure may be thermally coupled to the top cover and/or the semiconductor device, such as by filling any space between the coupled structures with TIM.

At block 1410, the method 1400 can include forming an encapsulation. For example, an encapsulant may be applied over and/or around the substrate, the semiconductor device, and/or the heat transfer structure. The encapsulant may be cured, thereby encasing and protecting the substrate, the semiconductor device, and/or the heat transfer structure. In some embodiments, top portions of the encapsulant may be removed, thereby exposing a top portion of the heat transfer structure.

Figure 15:
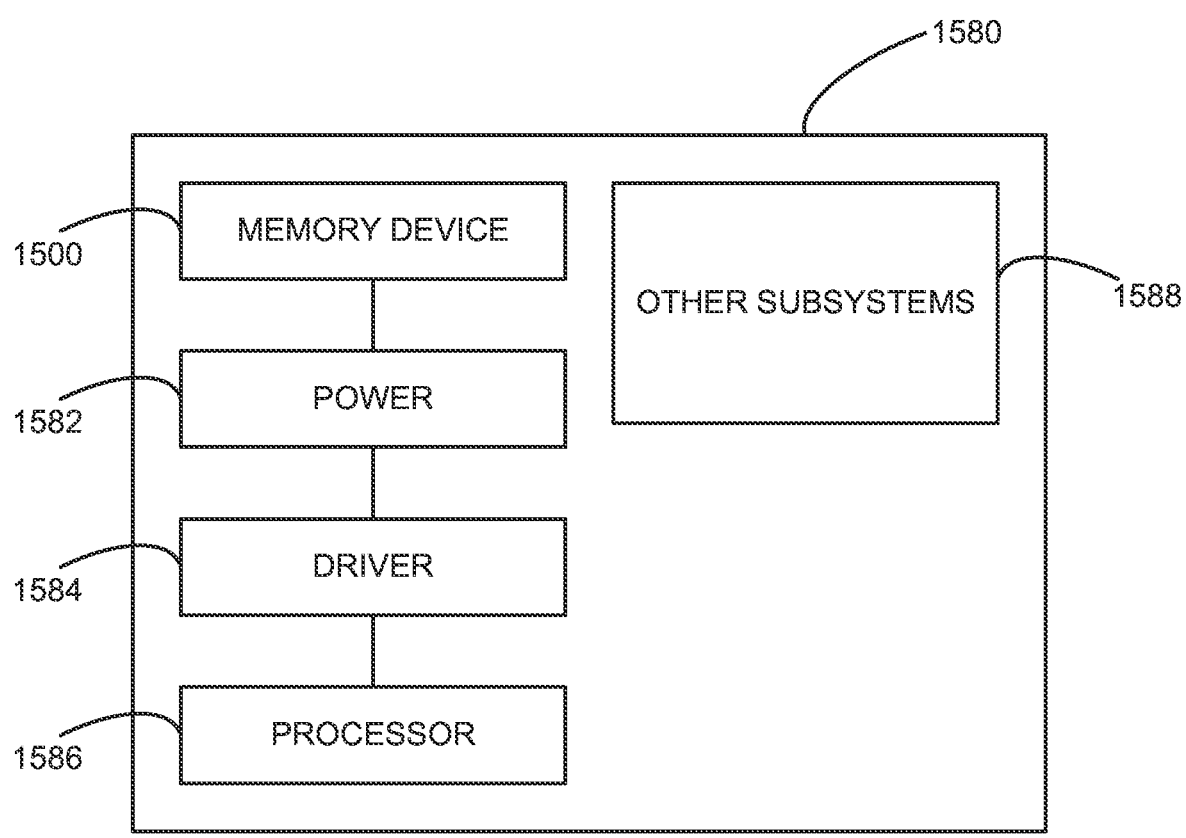
FIG. 15 is a schematic view of a system that includes an apparatus configured in accordance with embodiments of the present technology.

FIG. 15 is a schematic view of a system that includes an apparatus in accordance with embodiments of the present technology. Any one of the foregoing apparatuses (e.g., memory devices) described above with reference to FIGS. 3-14 can be incorporated into any of a myriad of larger and/or more complex systems, a representative example of which is system 1580 shown schematically in FIG. 15. The system 1580 can include a memory device 1500, a power source 1582, a driver 1584, a processor 1586, and/or other subsystems or components 1588, one or more of which can include features generally similar to those of the apparatus described above with reference to FIGS. 3-14, and can therefore include various features for performing a direct read request from a host device. The resulting system 1580 can perform any of a wide variety of functions, such as memory storage, data processing, and/or other suitable functions. Accordingly, representative systems 1580 can include, without limitation, hand-held devices (e.g., mobile phones, tablets, digital readers, and digital audio players), computers, vehicles, appliances and other products. Components of the system 1580 may be housed in a single unit or distributed over multiple, interconnected units (e.g., through a communications network). The components of the system 1580 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," and "having" are used throughout to mean including at least the recited feature(s) such that any greater number of the same feature and/or additional types of other features are not precluded. Reference herein to "one embodiment," "an embodiment," "some embodiments" or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-14.

What is claimed is:

1. An apparatus, comprising:
   a substrate having a top surface and a signaling layer, wherein:
      the top surface includes an opening that is at least partially defined by opposing vertical walls, wherein the opposing vertical walls are separated by an opening width measured along a lateral direction, and
      the signaling layer includes a top portion that is (1) below the top surface and (2) at least partially exposed through the opening in the top surface, wherein the signaling layer is configured to route one or more electrical signals along the lateral direction;
   a semiconductor device attached over the top surface, wherein the semiconductor device is electrically coupled to the signaling layer; and
   a heat transfer structure thermally coupled to the semiconductor device, the heat transfer structure including a substrate interface portion that is located in the opening in the top surface and directly attached to the at least partially exposed top portion of the signaling layer,
      wherein the heat transfer structure is configured to remove thermal energy from the semiconductor device and transfer at least a portion of the removed thermal energy to the signaling layer,
      wherein the substrate interface portion includes a peripheral edge that defines an outer boundary for a footprint of the heat transfer structure,
      wherein the peripheral edge defines an outermost portion of the heat transfer structure along the lateral direction, the peripheral edge located within the opening and between the opposing vertical walls, and
      wherein a lateral dimension of the substrate interface portion is less than the opening width and the substrate interface portion is separated from at least one of the opposing vertical walls of the opening along the lateral direction.

2. The apparatus of claim 1, wherein the signaling layer comprises internal connections within the substrate, the signaling layer corresponding to a planar grounding layer of the internal connections nearest to the semiconductor device.

3. The apparatus of claim 2, wherein the apparatus is configured to transfer the thermal energy from the semiconductor device along the lateral direction across the signaling layer and into internal portions of the substrate.

4. The apparatus of claim 2, further comprising:
an external connector attached to a bottom surface of the substrate and coupled to a portion of the internal connections,
wherein
the internal connections include one or more Through-Silicon Vias (TSVs) configured to transfer the thermal energy along a vertical direction and to the external connector for transferring the thermal energy out of the apparatus through the external connector.

5. The apparatus of claim 1, wherein:
the substrate is a printed circuit board (PCB) having a protective layer extending across a lateral plane and over the signaling layer, wherein the substrate includes an interface opening in the protective layer, the interface opening exposing a portion of the signaling layer; and
the heat transfer structure extends through the interface opening and directly attaches to the exposed portion of the signaling layer corresponding to the interface opening.

6. The apparatus of claim 1, wherein the heat transfer structure is a continuous structure including a thermally conductive material, the heat transfer structure including:
a device interface portion configured to thermally interface with the semiconductor device,
a transition portion extending between the device interface portion and the substrate interface portion,
wherein the device interface portion, the transition portion, and the substrate interface portion are integral with each other.

7. The apparatus of claim 1, wherein the heat transfer structure covers a first peripheral side of the semiconductor device and exposes a second peripheral side of the semiconductor device opposite the first peripheral side.

8. The apparatus of claim 1, wherein:
the heat transfer structure includes an attachment surface configured to directly attach to the signaling layer;
further comprising:
a plurality of Through-Silicon Vias (TSVs) below the signaling layer and overlapped by the attachment surface, the TSVs configured to transfer the thermal energy from the semiconductor device at least partially across a thickness of the substrate.

9. The apparatus of claim 1, further comprising:
an encapsulant at least partially encasing the top surface of the substrate, the semiconductor device, and/or the heat transfer structure, wherein at least one surface of the heat transfer structure is exposed for dissipating the thermal energy removed from the semiconductor device.

10. The apparatus of claim 1, wherein:
the opposing vertical walls of the opening includes a first wall and a second wall, wherein the first wall is located closer to a peripheral edge of the substrate than the second wall; and
the peripheral edge of the substrate interface portion on the heat transfer structure faces the first wall and is separated from the first wall along the lateral direction.

11. A semiconductor package, comprising:
a printed circuit board (PCB) having a top surface and internal electrical connections having a top signaling plane, wherein:
the top surface includes an opening that is at least partially defined by opposing vertical walls, wherein the opposing vertical walls are separated by an opening width measured along a lateral direction, and
the top signaling plane is (1) below the top surface and (2) at least partially exposed through the opening in the top surface, wherein the top signaling plane is configured to route one or more electrical signals along the lateral direction;
a semiconductor die attached over the top surface of the PCB;
a heat transfer structure thermally coupled to the semiconductor die, the heat transfer structure having a substrate interface portion that is located in the opening in the top surface and directly attached to the at least partially exposed top signaling plane,
wherein the heat transfer structure is configured to remove heat from the semiconductor device and transfer at least a portion of the removed heat into the internal electrical connections,
wherein the substrate interface portion includes a peripheral edge that corresponds to an outermost portion of the heat transfer structure along the lateral direction, the outermost portion positioned within the substrate interface portion between the opposing vertical walls, and
wherein a lateral dimension of the substrate interface portion is less than the opening width of the opening in the top surface and the substrate interface portion is in the opening and separated from at least one of the opposing vertical walls of the opening.

12. The semiconductor package of claim 11, wherein:
the semiconductor die is a flip chip; and
the PCB includes solder resist over the top signaling plane and comprising the top surface.

* * * * *